(12) United States Patent
Delgado et al.

(10) Patent No.: US 11,160,186 B2
(45) Date of Patent: Oct. 26, 2021

(54) CONTROL OF LOCAL SERVICE MODES FOR A MANAGEMENT CONSOLE

(71) Applicant: International Business Machines Corporation, Armonk, NY (US)

(72) Inventors: Angel E. Delgado, Vail, AZ (US); John C. Elliott, Tucson, AZ (US); Stephen Manthorpe, Tucson, AZ (US); Ronald A. Case, Sunnyvale, CA (US)

(73) Assignee: International Business Machines Corporation, Armonk, NY (US)

( * ) Notice: Subject to any disclaimer, the term of this patent is extended or adjusted under 35 U.S.C. 154(b) by 488 days.

(21) Appl. No.: 16/267,167

(22) Filed: Feb. 4, 2019

(65) Prior Publication Data

US 2020/0253080 A1 Aug. 6, 2020

(51) Int. Cl.
*H05K 7/14* (2006.01)
*G06F 1/18* (2006.01)
*H04L 12/24* (2006.01)

(52) U.S. Cl.
CPC .......... *H05K 7/1498* (2013.01); *G06F 1/187* (2013.01); *H04L 41/0836* (2013.01); *H05K 7/1492* (2013.01)

(58) Field of Classification Search
CPC .... H05K 7/1498; H05K 7/1492; G06F 1/187; H04L 41/0836
See application file for complete search history.

(56) References Cited

U.S. PATENT DOCUMENTS

| 9,456,515 | B2* | 9/2016 | Pecone | G06F 1/187 |
| 2003/0193781 | A1 | 10/2003 | Mori | |
| 2015/0173231 | A1 | 6/2015 | Rado et al. | |
| 2016/0189506 | A1* | 6/2016 | Peterson | G08B 13/08 340/551 |
| 2019/0042349 | A1* | 2/2019 | Sawal | G06F 11/2289 |

FOREIGN PATENT DOCUMENTS

| CN | 203591051 U | 5/2014 |
| CN | 207638177 U | 7/2018 |
| WO | 2014116847 A1 | 7/2014 |
| WO | 2015089474 A1 | 6/2015 |

\* cited by examiner

*Primary Examiner* — Duc C Ho
(74) *Attorney, Agent, or Firm* — Kunzler Bean & Adamson

(57) ABSTRACT

An apparatus for performing local service at a management console includes an accessory interface configured to engage a local service permission tool with a management console in a management enclosure for a computing system, the management enclosure having a closed position with predetermined boundary dimension and an open position, where during engagement with the management console, the local service permission tool prevents the management enclosure from being in the closed position. The apparatus includes a status module that detects whether the local service permission tool is engaged and an access module that disables one or more predetermined remote service functions of the management console in response to the status module detecting that the local service permission tool is engaged. A method and a system for performing local service at a management console perform similar functions to those of the apparatus.

20 Claims, 6 Drawing Sheets

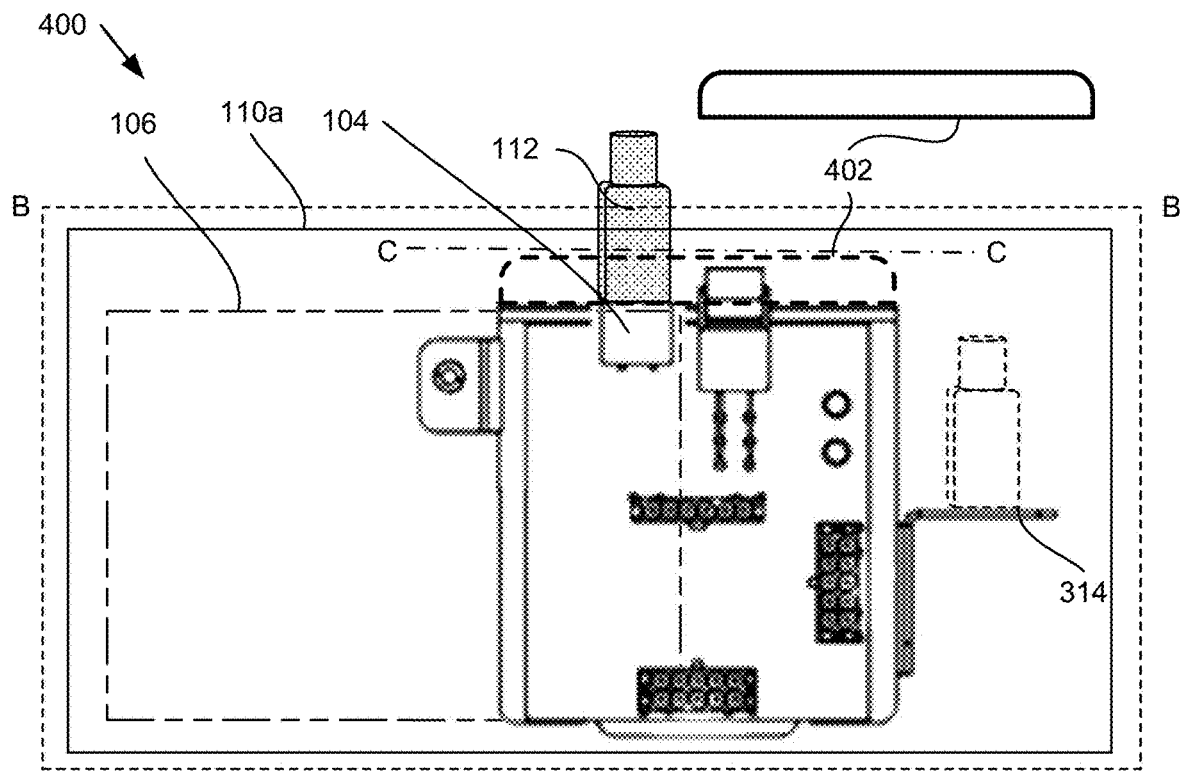
FIG. 4
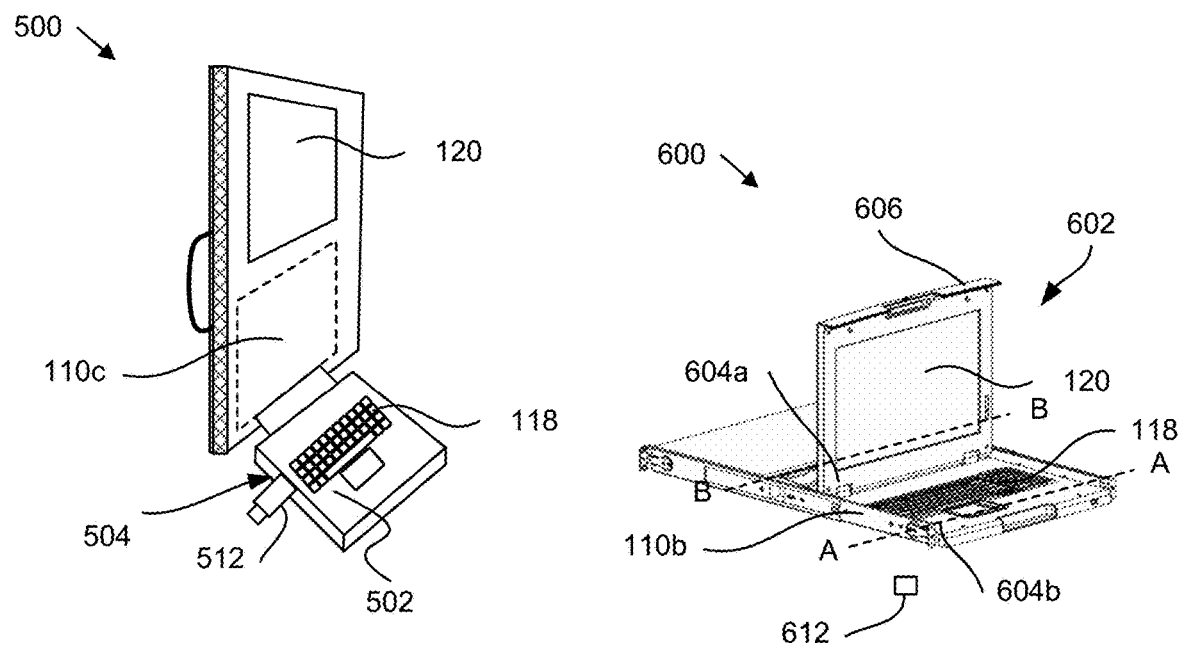
FIG. 5
FIG. 6

CONTROL OF LOCAL SERVICE MODES FOR A MANAGEMENT CONSOLE

FIELD

This invention relates to computing systems and more particularly relates to control of local service modes of a management console for a computing system.

BACKGROUND

Some complex computing systems such as computing systems used in data centers process and store large amounts of data on an ongoing basis. Such computing systems generally require configuration, maintenance, and other types of servicing from time to time. Service providers for such computing systems generally try to minimize interruption of ongoing operations and to ensure that computing systems continue normal operation as fully and/or as quickly as possible following potentially disruptive local services. However, sometimes normal operations including remote service operations are unexpectedly interrupted and sometimes normal operations do not continue as fully or as quickly as planned following local service visits.

SUMMARY

An apparatus for controlling local service modes of a management console for a computing system is disclosed. A method and system also perform the functions of the apparatus. In one embodiment, the apparatus includes an accessory interface configured to engage a local service permission tool with a management console in a management enclosure for a computing system, the management enclosure having a closed position with a predetermined boundary dimension and an open position, where during engagement with the management console, the local service permission tool prevents the management enclosure from being in the closed position. The apparatus includes a status module that detects whether the local service permission tool is engaged and an access module that disables one or more predetermined remote service functions of the management console in response to the status module detecting that the local service permission tool is engaged.

A method for controlling local service modes of a management console for a computing system is disclosed. In one embodiment, the method includes providing a local service permission tool with a management console for a computing system, the management console disposed in a management enclosure having a closed position with predetermined boundary dimension and an open position, where during engagement with the management console, the local service permission tool prevents the management enclosure from being in the closed position. In the embodiment, the method further includes detecting whether the local service permission tool is engaged and disabling one or more predetermined remote service functions of the management console in response to detecting that the local service permission tool is engaged.

A system for controlling local service modes of a management console for a computing system is disclosed. In one embodiment, the system includes, the computing system with a management console for managing the computing system. In the embodiment, the system further includes an enclosure for the management console, the management enclosure having a closed position with boundary dimensions and having an open position. The system includes a local service permission tool configured to engage with the management console, where during engagement with the management console, at least a portion of the local service permission tool extends beyond the boundary dimensions of the management enclosure and prevents the management enclosure from being in the closed position and where the management console detects whether the local service permission tool is engaged and disables one or more predetermined remote service functions of the management console in response to detecting that the local service permission tool is engaged.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which:

FIG. 4 is a schematic block diagrams illustrating one embodiment of a local service mode apparatus with an accessory interface for a management console in a management enclosure with a lid and with one embodiment of a local service permission tool in an engaged position.

FIG. 5 is a schematic block diagrams illustrating one embodiment of a management enclosure that is vertically oriented in an open position with a keyboard, a display, and a local service permission tool in an engaged position;

FIG. 6 is a schematic block diagrams illustrating one embodiment of a management enclosure that is horizontally oriented in an open position with a keyboard, a display, and a local service permission tool in an engaged position;

DETAILED DESCRIPTION

Figure 1:
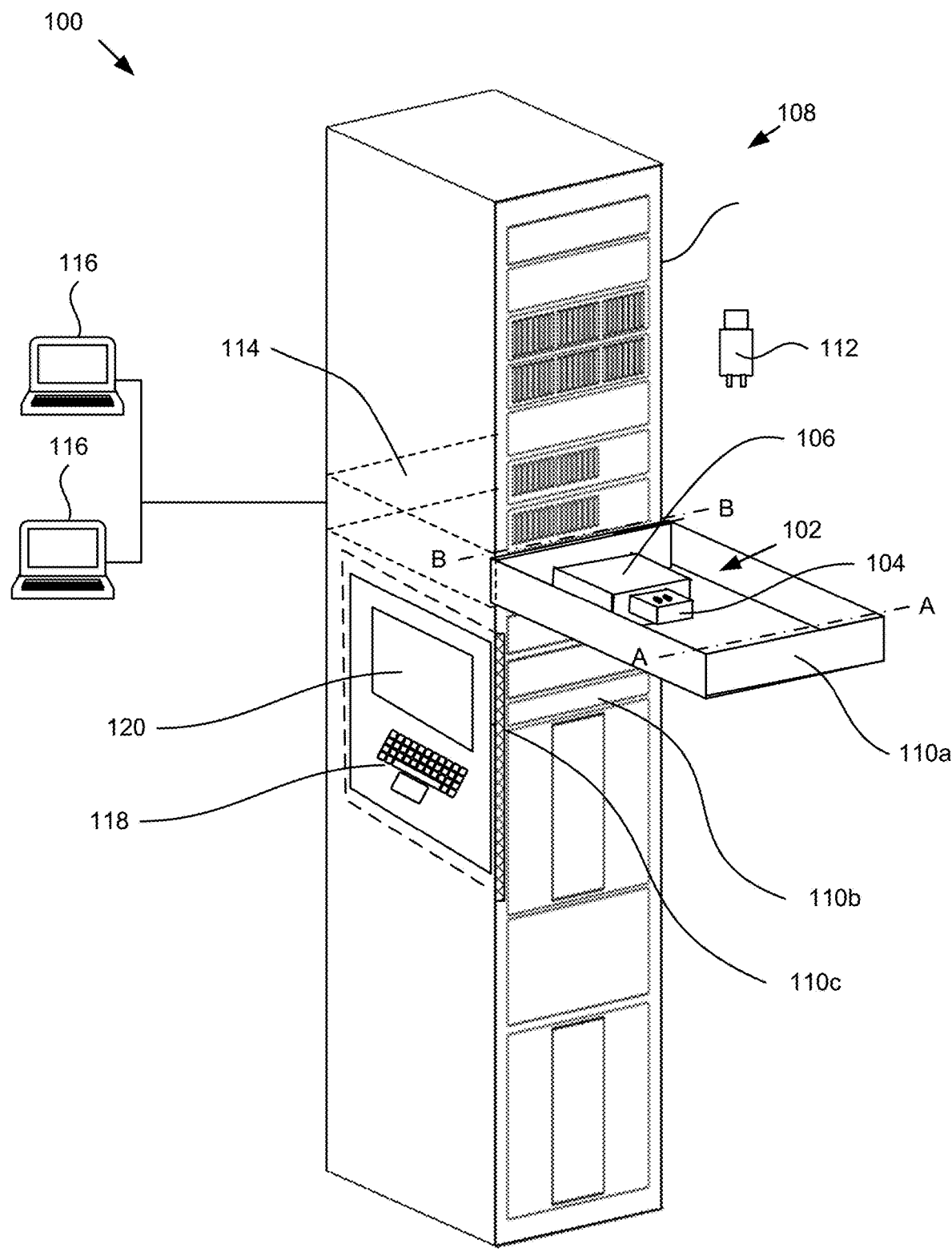
FIG. 1 is a block diagram of one embodiment of a system for controlling local service modes of a management console.

Disclosed herein are various embodiments providing methods, systems, and computer program products that can select locations on a storage device based on characterizations of adjacent location errors. Notably, the language used in the present disclosure has been principally selected for readability and instructional purposes, and not to limit the scope of the subject matter disclosed herein in any manner.

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Furthermore, the described features, advantages, and characteristics of the embodiments may be combined in any suitable manner. One skilled in the relevant art will recognize that the embodiments may be practiced without one or more of the specific features or advantages of a particular embodiment. In other instances, additional features and advantages may be recognized in certain embodiments that may not be present in all embodiments.

These features and advantages of the embodiments will become more fully apparent from the following description and appended claims or may be learned by the practice of embodiments as set forth hereinafter. As will be appreciated by one skilled in the art, aspects of the present invention may be embodied as a system, method, and/or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module," or "system." Furthermore, aspects of the present invention may take the form of a computer program product embodied in one or more computer readable medium(s) having program code embodied thereon.

Many of the functional units described in this specification have been labeled as modules, to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of program code may, for instance, comprise one or more physical or logical blocks of computer instructions which may, for instance, be organized as an object, procedure, or function. Nevertheless, the executables of an identified module need not be physically located together but may comprise disparate instructions stored in different locations which, when joined logically together, comprise the module and achieve the stated purpose for the module.

Indeed, a module of program code may be a single instruction, or many instructions, and may even be distributed over several different code segments, among different programs, and across several storage devices. Similarly, operational data may be identified and illustrated herein within modules and may be embodied in any suitable form and organized within any suitable type of data structure. The operational data may be collected as a single data set or may be distributed over different locations including over different storage devices, and may exist, at least partially, merely as electronic signals on a system or network. Where a module or portions of a module are implemented in software, the program code may be stored and/or propagated on in one or more computer readable medium(s).

The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory ("RAM"), a read-only memory ("ROM"), an erasable programmable read-only memory ("EPROM" or Flash memory), a static random access memory ("SRAM"), a portable compact disc read-only memory ("CD-ROM"), a digital versatile disk ("DVD"), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, to perform aspects of the present invention.

Aspects of the present invention are described herein with reference to flowchart illustrations and/or block diagrams of methods, apparatuses (systems, apparatuses), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The schematic flowchart diagrams and/or schematic block diagrams in the Figures illustrate the architecture, functionality, and operation of possible implementations of apparatuses, systems, methods and computer program products according to various embodiments of the present invention. In this regard, each block in the schematic flowchart diagrams and/or schematic block diagrams may represent a module, segment, or portion of code, which comprises one or more executable instructions of the program code for implementing the specified logical function(s).

It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated Figures.

Although various arrow types and line types may be employed in the flowchart and/or block diagrams, they are understood not to limit the scope of the corresponding embodiments. Indeed, some arrows or other connectors may be used to indicate only the logical flow of the depicted embodiment. For instance, an arrow may indicate a waiting or monitoring period of unspecified duration between enumerated steps of the depicted embodiment. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware and program code.

The description of elements in each figure below may refer to elements of proceeding figures. For instance, like numbers can refer to similar elements in all figures, including alternate embodiments of similar elements, unless otherwise clear from the context.

An apparatus for controlling local service modes of a management console includes an accessory interface for a management console of a computing system. In one embodiment, the accessory interface is disposed in a management enclosure and configured to engage with a local service permission tool. The management enclosure has a closed position with a predetermined boundary dimension and an open position, where engaging the local service permission tool with the accessory interface prevents the management enclosure from being in the closed position. The apparatus includes a status module that detects whether the local service permission tool is engaged and an access module that disables one or more predetermined remote service functions of the management console in response to the status module detecting that the local service permission tool is engaged.

In some embodiments, the accessory interface is disposed in the management enclosure at a position such that engaging the local service permission tool with the accessory interface causes at least a portion of an element selected from the local service permission tool and the management console to extend beyond the predetermined boundary dimension of the management enclosure. In various embodiments, the management enclosure includes one or more structures selected from a drawer, a lid, a tray, a compartment, a cabinet, etc. In certain embodiments, the local service permission tool is configured to detachably disengage from the accessory interface.

In some embodiments, the local service permission tool is attached to the accessory interface and is configurable to move between an extended position that prevents the management enclosure from being in the closed position and a retracted position that allows the management enclosure to be in the closed position. In certain embodiments, in the extended position at least a portion of the local service permission tool extends beyond the predetermined boundary dimension of the management enclosure. In various embodiments, the management enclosure in the closed position encloses one or more devices such as a keyboard, a monitor, the management console, network switches for remote service, and/or a secondary management console.

In various embodiments, the status module detects an electrical connection in the accessory interface established by engagement of the local service permission tool with the accessory interface. In some embodiments, the electrical connection in the accessory interface is established by the local service permission tool performing at least one of acting as an electrical jumper, triggering closure of a magnetic switch, and triggering closure of an optical switch. In certain embodiments, the access module further selects which of the one or more predetermined remote service functions of the management console to disable based on one or more potentially disruptive local service functions scheduled to be performed during engagement of the local service permission tool. In some embodiments, the one or more potentially disruptive local service functions are selected from removing power from the computing system and taking portions of the computing system offline outside of normal code-controlled paths.

A method includes providing a local service permission tool, providing an accessory interface for a management console of a computing system, the accessory interface disposed in a management enclosure and configured to engage with the local service permission tool, the management enclosure having a closed position with a predetermined boundary dimension and an open position, where engaging the local service permission tool with the accessory interface prevents the management enclosure from being in the closed position. The method includes, in one embodiment, detecting whether the local service permission tool is engaged and disabling one or more predetermined remote service functions of the management console in response to detecting that the local service permission tool is engaged.

In various embodiments, the method includes disposing the accessory interface at a position within the management enclosure whereby engaging the local service permission tool with the accessory interface causes at least a portion of an element selected from the local service permission tool and the management console to extend beyond the predetermined boundary dimension of the management enclosure. In certain embodiments, the management enclosure includes one or more structures such as a drawer, a lid, a tray, a compartment, and so forth. In some embodiments, the method includes configuring the local service permission tool to detachably disengage from the accessory interface.

In certain embodiments, the method includes configuring the local service permission tool to be attached to the accessory interface and to move between an extended position that prevents the management enclosure from being in the closed position and a retracted position that allows the management enclosure to be in the closed position. IN some embodiments, in the extended position at least a portion of the local service permission tool extends beyond the predetermined boundary dimension of the management enclosure. In various embodiments, the method includes detecting an electrical connection in the accessory interface established by engaging the local service permission tool with the accessory interface to perform at least one of acting as an electrical jumper, triggering closure of a magnetic switch, and triggering closure of an optical switch.

In some embodiments, the method includes selecting which of the one or more predetermined remote service functions of the management console to disable based on one or more potentially disruptive local service functions scheduled to be performed during engagement of the local service permission tool, the one or more potentially disruptive local service functions being selected from removing power from the computing system and taking portions of the computing system offline outside of normal code-controlled paths.

A system includes a computing system having a management console, a management enclosure within the computing system and having a closed position with predetermined boundary dimension and an open position, a local service permission tool; and an accessory interface for the management console, where the accessory interface is disposed in the management enclosure and configured to engage the local service permission tool with the accessory interface thereby preventing the management enclosure from being in the closed position. In one embodiment the management console detects whether the local service permission tool is engaged and disables one or more predetermined remote service functions of the management console in response to detecting that the local service permission tool is engaged.

FIG. 1 is a block diagram of one embodiment of a system 100 for controlling local service modes of a management console. The system 100 includes a local service mode apparatus 102 with an accessory interface 104 for a management console 106 of a computing system 108. The accessory interface 104 is disposed in a management enclosure 110 (which may be depicted and referred to individually as 110*a*, 110*b*, 110*c*, etc.) and configured to engage with a local service permission tool 112. In certain embodiments, the computing system 108 also includes one or more remote management consoles 116. In some embodiments the computing system 108 may include a keyboard 118 and a display 120.

In various embodiments, the computing system 108 includes different types of modular components that fit within enclosures that mount into a rack such as a standard 19-inch wide rack that conforms to standard specifications such as Electronic Industry Alliance ("EIA") 310-D specifications. For example, the system 100 depicted in FIG. 1 may include processor nodes, high performance flash enclosures, I/O enclosures, storage enclosures, and at least one management enclosure e.g. 110*a*. As used herein, the term enclosure" may be used to refer to a drawer-type enclosure, a screw-mounted enclosure, a vertical pull-out enclosure, a receptacle with a lid, and so forth.

In certain embodiments, the management console 106 is used to support advanced service functions such as hardware and firmware installation and maintenance activities. For example, the computing system 108 depicted in FIG. 1 is a data system with high-performance storage devices and extremely fast response times which is used to support complex IT environments, and emerging cloud, motion mobile, social, analytics, and cognitive workloads.

In certain embodiments, the management enclosure provides internal communications to all of the modular components of the computing system 108. In some embodiments, the management enclosure e.g., 110*a*, 110*b*, and/or 110*c* also provides external connectivity using one or more network cable from one or more local management consoles e.g., 106 to one or more remote management consoles 116 on a private network.

In various embodiments one management enclosure e.g., 110a provides connectivity from one or more management consoles e.g., 106 to another type of management enclosure e.g., 110b and 110c that encloses a keyboard/mouse and video for local management e.g., via a keyboard 118 and a display 120 in what is referred to broadly herein as a management enclosure 110c that is vertically oriented and pulls out from one side of the rack or via a keyboard/display in a horizontal drawer that is also referred to broadly herein as a management enclosure e.g., 110b.

The term "management enclosure" is used herein to refer to an enclosure that encloses one or more hardware management consoles e.g. 106 as well as other components such as network switches that connect to one or more remote management consoles 116 i.e. outside of the management enclosure 110a. The term "management enclosure" is also used to refer to enclosures that enclose components that interface with or are related to management consoles such as keyboards, displays, jumpers, switches, connectors and so forth that are useful to a local service user for performing functions (configuration, power control, diagnostics, and so forth) related to management of the computing system 108.

In some embodiments, a management enclosure such as the management enclosure 110a also encloses components such as network switches, cables, and the like that are useful to a remote service user for performing functions related to management of the computing system.

In various embodiments, the management enclosure (e.g., 110a, 110b, 110c) has a closed position (e.g., pushed into the rack) and an open position (e.g. pulled part way out of the rack). In some embodiments, components within the management enclosure may be mechanically accessed in the open position. For example, the management enclosure e.g., 110b, 110c enclose a keyboard e.g., 118 and/or a display e.g., 120 that may be mechanically accessed by a local service user when the management enclosure 110b,110c is pulled out to the open position.

In various existing computing systems, different service functions may be performed remotely using remote service functions. Certain potentially disruptive services are performed on-premises using a management console of the computing system for both operational and security reasons. Potentially disruptive services may be performed by a service representative that travels to the side of the computing system to perform the local services using the management console. In existing systems, a service representative using a management console may rely on training and/or memory to ensure that potentially disruptive services are performed deliberately and through the local management console so as not to inadvertently interrupt operations or conflict with remote service functions.

For example, if potentially disruptive local service function such as shutting down power to the computing system or taking a portion of the computing system offline is performed using a local management console at the same time as remote service function is being performed such as configuring an I/O module, the local service function may detrimentally disrupt the remote service function.

Additionally, in existing systems, if a local service mode is entered to perform potentially disruptive local service functions by entering a command from the management console or even by flipping a mechanical switch in a panel of the rack, the local service mode may prevent certain remote service functions from being performed while the computing system is in the local service mode, but the management console may remain in the local service mode. In some cases, this requires a follow-up local service call to enable the management console to perform remote service functions which may delay or disrupt remote servicing and/or operations until the follow-up service takes place.

The local service mode apparatus 102 improves the operation of the management console 106 and the computing system 108 by providing an apparatus, system and method that required deliberate and noticeable local actions to be performed in order to disable certain remote service mode functions from being perform while performing potentially disruptive local service functions.

Moreover, the local service mode apparatus 102 also improves the operation of the management console 106 and the computing system 108 by minimizing a likelihood that the management console 106 is inadvertently or unexpectedly left in a local service mode that disables remote service operations until a follow-up local service can be performed. Further details regarding control of local service modes of a management console for a computing system are provided below beginning with a detailed description of the apparatus depicted in FIG. 2 with some references also to FIG. 1.

Figure 2:
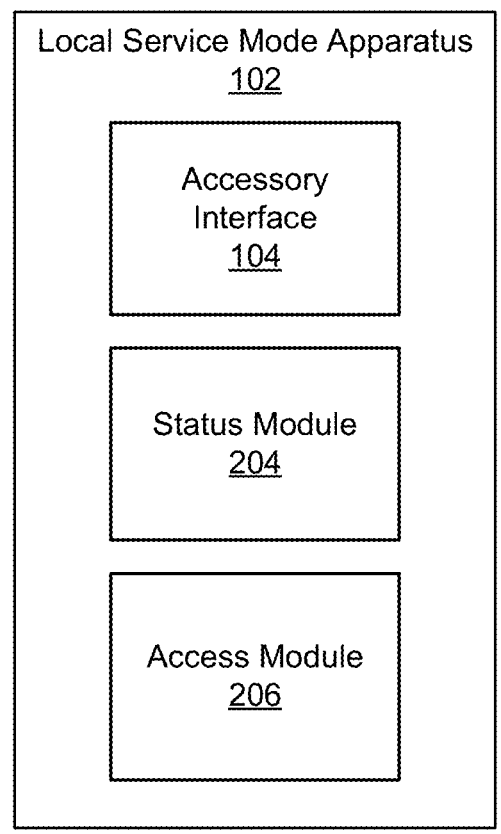
FIG. 2 is a block diagram of one embodiment of an apparatus for controlling local service modes of a management console.

FIG. 2 is a block diagram of one embodiment of an apparatus 200 for controlling local service modes of a management console. The apparatus 200 includes an embodiment of local service mode apparatus 102 with an accessory interface 104, a status module 204, and an access module 206 which are described below.

The apparatus 200, in one embodiment, includes an accessory interface 104 disposed in a management enclosure e.g., 110a. The accessory interface 104 is configured to engage with a local service permission tool 112. The apparatus 200 also includes a status module 204 that detects whether the local service permission tool 112 is engaged. The apparatus 200 also includes an access module 206 that enable certain local service functions to be performed e.g., using the management console 106 in response to the status module 204 detecting that the local service permission tool 112 is engaged. In various embodiments, the access module 206 also disables one or more predetermined remote service functions of the management console 106 in response to the status module 204 detecting that the local service permission tool 112 is engaged.

Beneficially, in various embodiments, engaging the local service permission tool with the accessory interface 104 in order to perform certain potentially disruptive local service functions provides a visual and tangible action confirming and reminding anyone using or viewing the computing system 108 that the local service mode is being entered for the purpose of performing the potentially disruptive functions.

In one embodiment, the management enclosure 110a has a closed position and an open position. In the closed position, the management enclosure has a predetermined boundary dimension (e.g., the imaginary plane extending from the front lip (depicted at line A-A in FIG. 1) of the management enclosure 110a to the back lip (depicted at line B-B in FIG. 1) of the management enclosure 110a. In certain embodiments, this predetermined boundary dimension represents a boundary of the management enclosure 110a beyond which components in the management enclosure 110a may not extend while the management enclosure 110a is in the closed position.

In the open position, the local service permission tool 112 can engage (mechanically and in various embodiments, electrically) with the accessory interface 104. Describing first the mechanical engagement, in one embodiment, the accessory interface 104 is a keyed socket into which a portion of the local service permission tool 112 is inserted to mechanically engage the accessory interface 104 with the local service permission tool 112. In various embodiments, engaging the local service permission tool 112 with the accessory interface 104 prevents the management enclosure 110 from being in the closed position.

For example, in some embodiments, the accessory interface 104 is disposed within the management enclosure e.g., 110a, at a position such that engaging the local service permission tool 112 with the accessory interface 104 causes at least a portion of the local service permission tool 112 to extend beyond the predetermined boundary dimension of the management enclosure e.g., above the top of the drawer e.g. the management enclosure 110a, thus blocking the management enclosure 110a from sliding into the rack to the closed position.

Additional details with respect to various embodiments of structures and functions by which the local service permission tool 112 controls the local service mode of the management console 106 by interacting with the management enclosure e.g., 110a, 110b, and 110c in an open position are described below with respect to FIGS. 3A-3E, 4, 5 and 6. It may be noted that the computing system 108 may include more than one management enclosure (as used herein) and the management enclosure in which the accessory interface e.g., 110b, 110c is enclosed does not necessarily need to enclose any management console 106. For example, the management enclosure 110b or 110c may enclose a keyboard 118 and a display 120 that electronically communicates with the management console 106 in the management enclosure disposed in the management enclosure 110a via electrical cables or wirelessly.

Turning now to the structure and function of the status module 204 and the access module 206 of the local service mode apparatus 102. In various embodiments, the management console 106 includes its own computing device (not shown) with a processor that executes program instructions from internal memory to communicate with various interfaces and devices in the management enclosure 110a and with the larger computing system 108. For example, in some embodiments, the processor of the management console 106 communicates e.g. at a baseboard management controller ("BMC") level, with various devices or interfaces including the other components of the computing system 108 such as I/O enclosures, processing modes, the high performance computing nodes, etc., in order to perform local service functions.

In various embodiments, status module 204 and the access module 206 are implemented at least in part using program code in the management console 106. For example, in some embodiments, the status module 204 communicates with the accessory interface 104 and detects whether the local service permission tool 112 is engaged with the accessory interface. In one embodiment, the access module 206 disables one or more predetermined remote service functions of the management console 106 in response to the status module 204 detecting that the local service permission tool 112 is engaged with the accessory interface 104.

For example, the local service permission tool 112 may be implemented as an electrical jumper that electrically engages with the accessory interface 104 to establish an electrical connection between terminals of the accessory interface 104. The status module 204 detects the electrical connection e.g., by the processor of the management console 106 reading a device port connected to the accessory interface and the access module 206 disables one or more predetermined remote service functions of the management console 106 (such as remote configuration of hardware components of the computing system 108) in response to the status module 204 detecting that the local service permission tool 112 is engaged with the accessory interface 104.

In certain embodiments, the electrical connection in the accessory interface is established by the local service permission tool 112 performing at least one of acting as an electrical jumper, triggering closure of a magnetic switch, and triggering closure of an optical switch. For example, the local service permission tool 112 may include a magnet that causes a magnetic switch in the accessory interface 104 to close which the local service permission tool is engaged. Similarly, the accessory interface 104 may include an optical switch that closes when the local service permission tool 112 is engaged. In some embodiments, the accessory interface 104 may include an optical code reader that reads a 2D barcode associated with the local service permission tool 112 to identify a particular local service user.

In some embodiments, the access module 206 selects which of the one or more predetermined remote service functions of the management console 106 to disable based on one or more potentially disruptive local service functions scheduled to be performed during engagement of the local service permission tool 112 such as removing power from the computing system and taking portions of the computing system offline outside of normal code-controlled paths.

For example, turning off power to the computing system 108 can be very disruptive to service functions that can otherwise be performed remotely such as reprogramming a configuration flash device in a server node or a storage enclosure. As a further example, if the local service function scheduled to be performed is to take a particular server node of the computing system 108 offline, the access module 206 may select to disable predetermined remote service functions related to the particular service node. The access module 206 may enable or disable many other types of remote service functions based on whether the local service permission tool 112 is engaged as well as base on other types of local service functions scheduled to be performed and various conditions for enabling or disabling different remote service functions may be predetermined by a person of skill in the art.

Consistent with the use of the term module as described above, all or various portions of the status module 204 and/or the access module 206 may be implemented in software or in hardware or in a combination of software and hardware and the status module 204 and/or the access module 206 may be distributed among various processors and/or hardware devices.

FIGS. 3A-3E are a series of schematic block diagrams illustrating a side view perspective of the apparatus 200 depicted in FIG. 2 for controlling local service modes of a management console for a computing system with an accessory interface 104 and a management console 106 in a management enclosure 110a. The apparatus 200 operates substantially as described above with respect to FIG. 2. FIGS. 3A-3E provides additional details and/or modifications with respect to the mechanical interaction between the local service permission tool 112 or 302 and the management enclosure 110a.

Figure 3A:
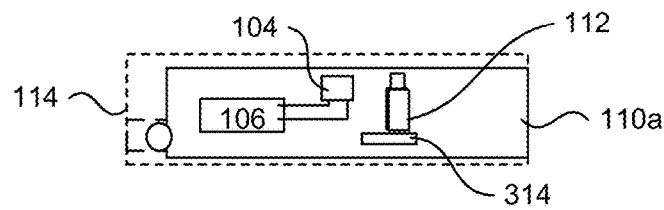
FIG. 3A is a schematic block diagrams illustrating a side view perspective of the apparatus of FIG. 2 with an accessory interface 104 for a management console in a management enclosure in a closed position with one embodiment of a detachable local service permission tool in a disengaged position.

FIG. 3A illustrating a side view perspective of the apparatus 200 for controlling local service modes of a management console for a computing system with an accessory interface 104 and a management console 106 in a management enclosure 110a is in a closed position with a local service permission tool 112 in a disengaged position. In this example, the management enclosure 110a is a drawer that slides into the closed position in a slot 114 of the rack.

The management enclosure 110a includes a storage station 314 disposed at a position (e.g., low enough) within the management enclosure 110a to allow the local service permission tool 112 to be stored inside the management enclosure 110a in the closed position i.e., with the drawer shut. In some embodiments, the storage station 314 is an easily accessible storage place with no electrical function. In other embodiments, the status module 204 may also detect whether the local service permission tool 112 is stored at the storage station 314 in order to detect with the management enclosure in the closed position whether the local service permission tool 112 is present or missing.

Figure 3B:
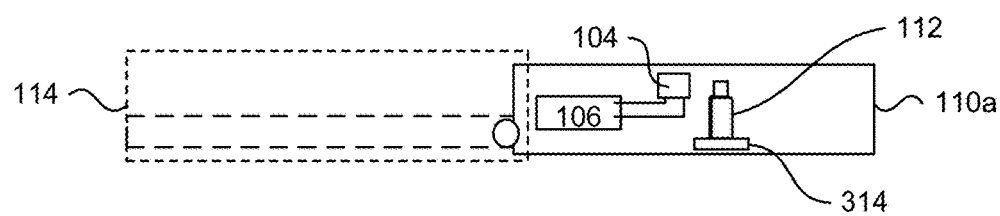
FIG. 3B is a schematic block diagrams illustrating a side view perspective of the apparatus of FIG. 2 with an accessory interface 104 for a management console in a management enclosure in an open position with one embodiment of a detachable local service permission tool in a disengaged position.

FIG. 3B is a schematic block diagram illustrating the apparatus 200 of FIG. 3A in an open position with one embodiment of a local service permission tool 112 in a disengaged position. In one embodiment, the management enclosure 110a is pulled open making the local service permission tool 112 visible and accessible to a local service user.

Figure 3C:
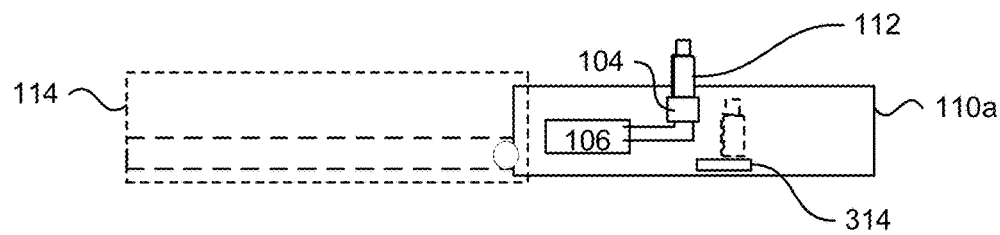
FIGS. 3C and 3D are schematic block diagrams illustrating a side view perspective of the apparatus of FIG. 2 with an accessory interface 104 for a management console in a management enclosure in an open position with one embodiment of a detachable local service permission tool in an engaged position.
Figure 3D:
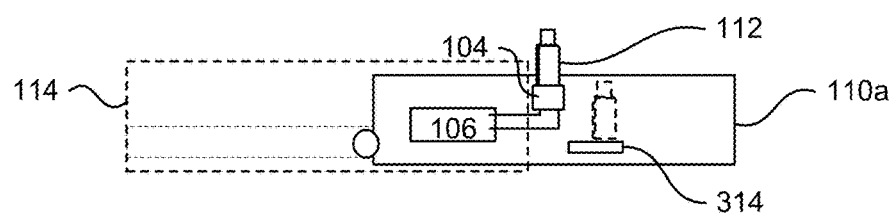

FIGS. 3C and 3D are schematic block diagrams illustrating the apparatus 200 of FIG. 3A with the management enclosure 110a in the open position and the local service permission tool 112 in an engaged position. FIG. 3C depicts the local service permission tool removed from the storage station 314 and engaged with the accessory interface 104 which is detected by the status module 204 and responded to by the access module 206 as described above with respect to FIGS. 1 and 2. FIG. 3D illustrates that engaging the local service permission tool 112 with the accessory interface 104 causes at least a portion of the local service permission tool 112 to extend beyond the predetermined boundary dimension of the management enclosure 110a so as to prevent the management enclosure 110a from sliding back into the closed position.

Preventing the management enclosure 110a from being closed with the local service permission tool 112 engage prevents the management console 106 from inadvertently or unnoticeably being left in local service mode, thereby improving the function of the management console 106 and the computing system 108 over existing systems where such inadvertent or unnoticeable actions sometime occur. A further improvement is illustrated below in FIG. 3E.

Figure 3E:
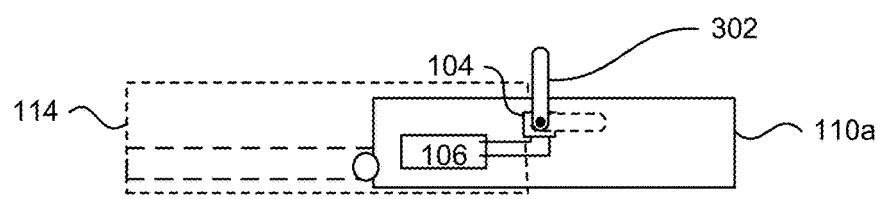
FIG. 3E is a schematic block diagrams illustrating a side view perspective of another embodiment of the apparatus of FIG. 2 with an accessory interface 104 for a management console in a management enclosure in an open position with one embodiment of an attached local service permission tool in an engaged position.

FIG. 3E is a schematic block diagrams illustrating the apparatus 200 of FIG. 2 with an accessory interface 104 for a management console in a management enclosure in an open position with one embodiment of the local service permission tool 112 in an engaged position. In certain embodiments, the local service permission tool 112 is attached to the accessory interface and is configurable to move between an extended position that prevents the management enclosure from being in the closed position and a retracted position that allows the management enclosure to be in the closed position. For example, FIG. 3E illustrates one embodiment of the attached local service permission tool 302 with a moveable e.g., rotatable arm that blocks closure of the management enclosure 110a with the arm rotated up and allows the management enclosure 110a to be slid into closed position with arm rotated down.

FIG. 4 is a schematic block diagrams illustrating one embodiment of an apparatus 400 for controlling local service modes of a management console for a computing system. The apparatus 400 includes one embodiment of a local service mode apparatus 102 with an accessory interface 104, status module 204 (not shown) and an access module 206 (not shown). In the depicted embodiment, the accessory interface 104 includes a lid 402 which is shown in an open position (solid lines) and a closed position (dashed lines).

In one embodiment, the lid 402 encloses the accessory interface 104 and has a predetermined boundary dimension depicted as line C-C in the closed position of the lid 402. In certain embodiments, the surrounding management enclosure 110a encloses the lid 402 in the closed position so that the lid is a management enclosure within the management enclosure 110a because the lid encloses the accessory interface 104.

In some embodiments, the accessory interface 104 is positioned so that by engaging the local service permission tool 112 the lid 402 is prevented from being in the closed position. In closing the management enclosure 402a within the management enclosure 110a provides an additional layer of hierarchical structure serves as a reminder to a local service user to remove the local service permission tool 112 in order to replace the lid 402 before sliding the management enclosure 110a into the slot 114 of the rack.

In various embodiments, the apparatus 400 includes an attached local service permission tool 302 with a moveable (e.g., rotatable) arm as depicted in FIG. 3E rather than a detachable local service permission tool 112 as depicted in FIGS. 2 and 3A-3D.

FIG. 5 is a schematic block diagram illustrating one embodiment of an apparatus 500 for controlling local service modes of a management console e.g., 102 or 502. The apparatus 500 includes a vertically oriented management enclosure 110c that encloses a keyboard 118 and a display 120 substantially as depicted above with respect to FIG. 1.

In some embodiments, the keyboard 118 and the display 120 act as user interface devices that connect to a management console 106 in a different management enclosure. In other embodiments, the keyboard 118 and display 120 are part of a management console 502 that is, for example, implemented in a laptop computer. In certain embodiments, the local service permission tool 512 is engaged by inserting it into an accessory interface in the management console 502 e.g. a port in the laptop.

In various embodiments, engaging the local service permission tool 512 with the accessory interface 504 causes at least a portion of one of the local service permission tool 512 and the management console 106 or 502 to extend beyond the predetermined boundary dimension of the management enclosure 110c. For example, if the local service permission tool 512 is engaged and sticking out of the accessory interface 504 implemented in a side port of the management console 502 as shown in FIG. 5, the local service permission tool 512 extends beyond the predetermined boundary dimension e.g., on the side of the management enclosure 110c.

FIG. 6 is a schematic block diagram illustrating one embodiment of another apparatus 600 for controlling local service modes of a management console e.g., 102 or 602. The apparatus 600 includes a horizontally oriented management enclosure 110b that encloses a keyboard 118 and a display 120 substantially as depicted above with respect to FIG. 1. In one embodiment, the management enclosure e.g., 110b includes one or more structure selected from a drawer, a lid, a tray, a compartment, a cabinet, etc. for example, the management enclosure 110b may include a drawer, that holds a laptop, in a tray where the laptop has a lid and includes a keyboard 118 and display 120.

In such an embodiment, one or more accessory interfaces may be disposed at a location relative to the enclosure 602/that engaging the local service permission tool 612 with the accessory interface 604*a* or 604*b* causes at least a portion of an element selected from the local service permission tool 612 and the management console 602 to extend beyond the predetermined boundary dimension (e.g., the imaginary plane form between lines A-A and B-B) of the management enclosure 110*b*. For example, the accessory interface 604*a* or 604*b* may be disposed in or on the bezel of the display 120 of the laptop or next to a touchpad of the keyboard 118 so that engaging the local service permission tool 612 with the accessory interface 604*a* or 604*b* causes the lid 606 of the management console 602 to extend beyond the predetermined boundary dimension.

Figure 7:
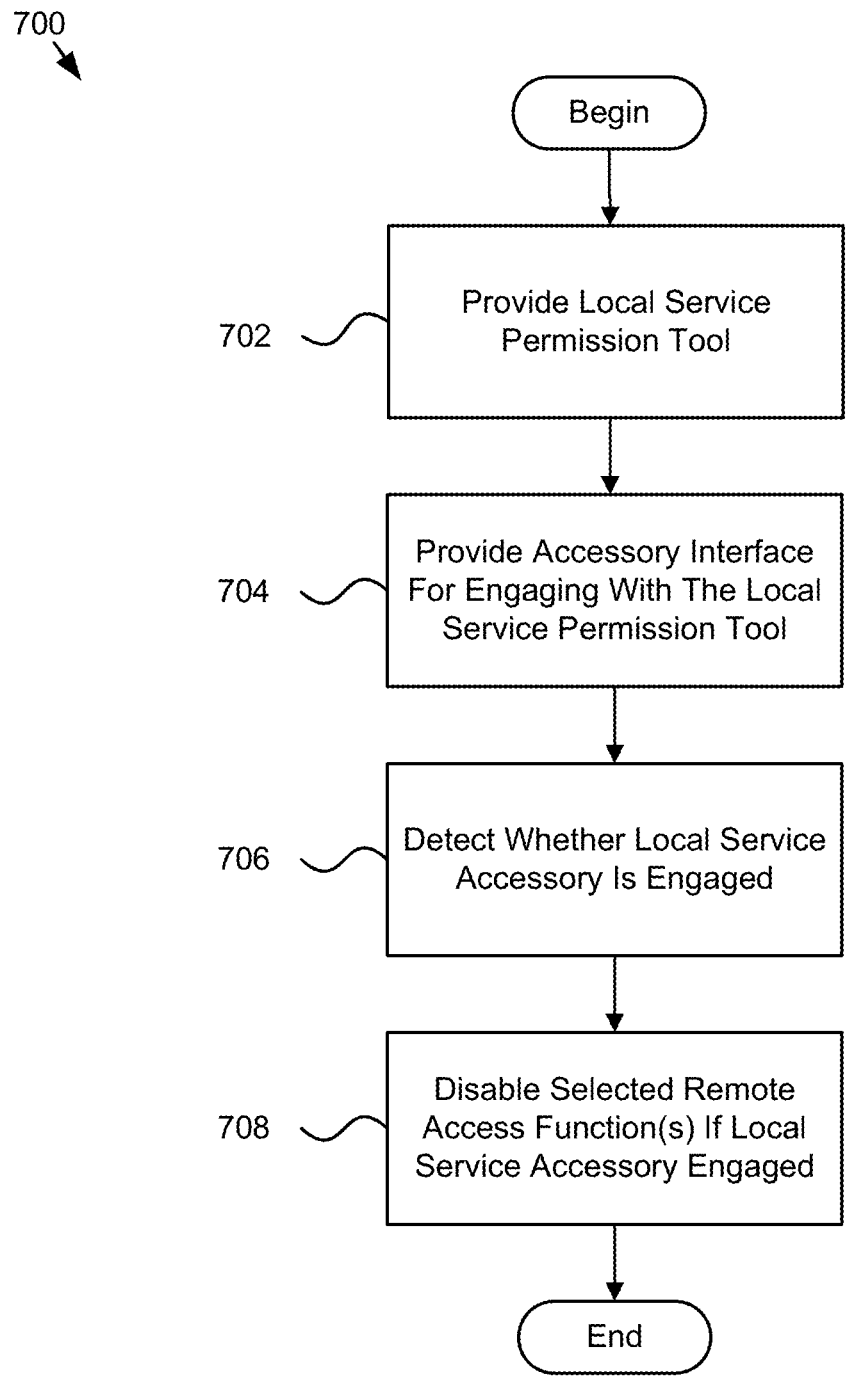
FIG. 7 is a flowchart diagram illustrating one embodiment of a method for controlling local service modes of a management console.

FIG. 7 is a flowchart diagram illustrating one embodiment of a method 700 for controlling local service modes of a management console. In one embodiment, the method begins and provides 702 a local service permission tool. The method further provides 704 an accessory interface for a management console of a computing system, the accessory interface disposed in a management enclosure and configured to engage with the local service permission tool, where the management enclosure has a closed position with a predetermined boundary dimension and an open position, and where engaging the local service permission tool with the accessory interface prevents the management enclosure from being in the closed position.

The method 700 detects 706 whether the local service permission tool is engaged. The method 700 disables 708 one or more predetermined remote service functions of the management console in response to detecting that the local service permission tool is engaged and the method 700 ends. All or portions of the steps of the method 700 may be implemented using the local service permission tool 112, the accessory interface 104, the status module 204, and/or the access module 206.

Figure 8:
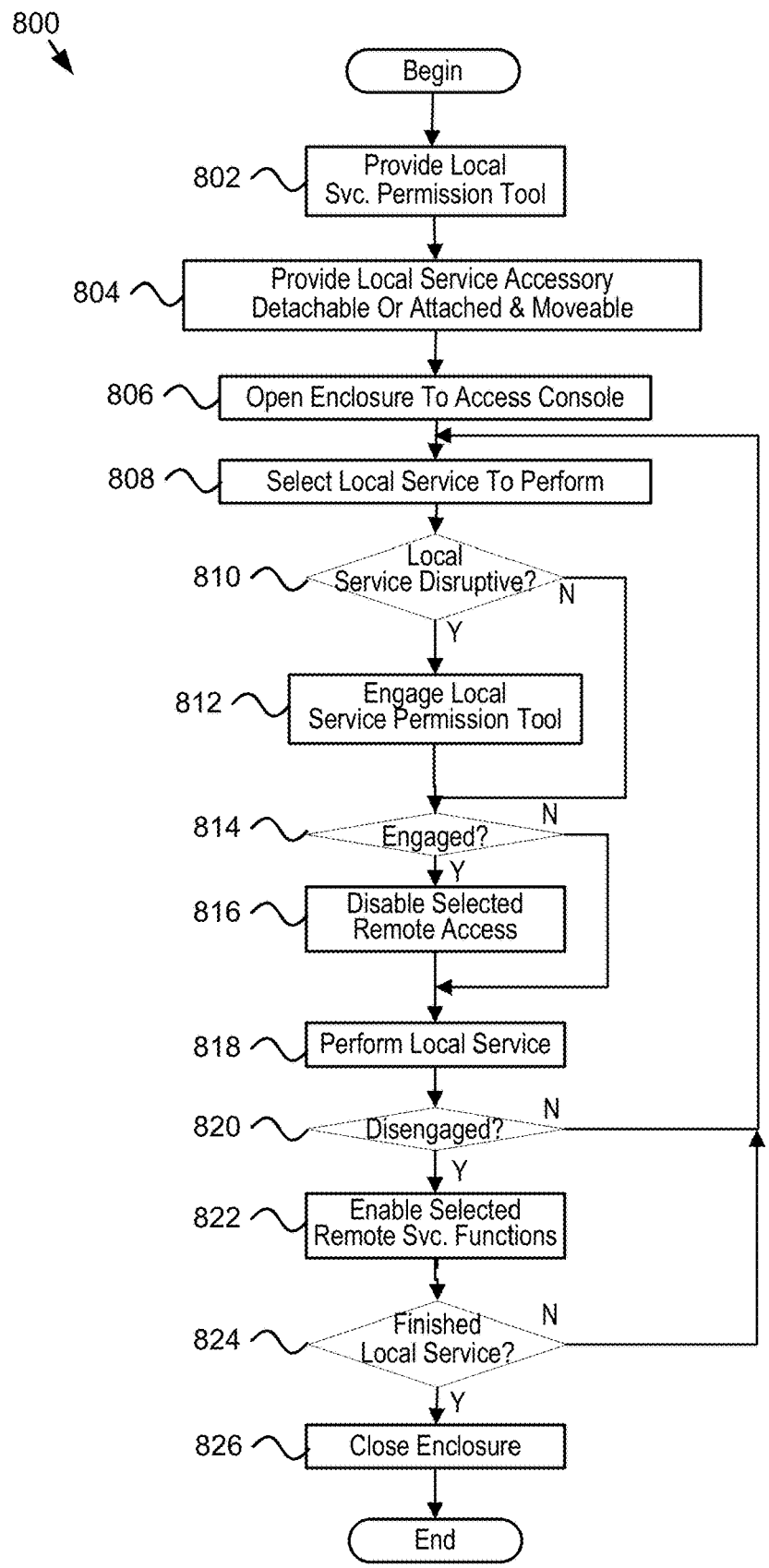
FIG. 8 is a flowchart diagram illustrating another embodiment of a method for controlling local service modes of a management console.

FIG. 8 is a flowchart diagram illustrating another embodiment of a method 800 for controlling local service modes of a management console. The method 800 begins and provides 802 a local service permission tool and further provides 804 and an accessory interface for management console of a computing system, where the accessory interface is disposed in a management enclosure and configured to engage with the local service permission tool. The management enclosure has a closed position with the predetermined boundary dimension and an open position where engaging the local service permission tool with the accessory interface prevents the management enclosure from being in the closed position. In certain embodiments, the method 800 continues and includes opening 806 the enclosure e.g., in order to access the management console and/or to access the accessory interface to engage it with the local service permission tool.

In certain embodiments, the method 800 includes selecting 808 one or more local service functions to perform. The method 800 determines 810 whether the one or more local service functions to perform are disruptive. If the one or more local service functions are disruptive, e.g., performing them would cause a conflict with remote service functions, or prevent one or more remote service functions from being correctly performed, the method includes engaging 812 the local service permission tool e.g., by inserting it into the accessory interfaces in some detachable local service tool embodiments, or by moving e.g., rotating the local service permission tool in other embodiments.

In various embodiments, the method 800 includes detecting 814 whether the local service permission tool is engaged. If the local service permission tool is engaged, the method 800 disables 816 one or more predetermined remote service function of the management console. For example, if the local service permission tool is engaged, a remote service function such as configuring a component of the computer system is disabled. If the local service permission tool is not engaged, the method does not disable the selected remote service functions. In some embodiments, detecting 814 whether the local service permission tool is engaged includes detecting whether the local service permission tool is acting as an electrical jumper, triggering closure of a magnetic switch, or triggering closure of an optical switch.

In some embodiments, the method 800 includes performing 818 the selected local services. In various embodiments, the method 800 includes determining 820 whether the local service permission tool is disengaged. It may be noted that engagement of the local service permission tool prevents the management enclosure from being in the closed position. Therefore, in certain embodiments, if the local service permission tool in not disengaged, (e.g., is engaged so as to extend beyond the predetermined boundary of the management enclosure e.g., above the top of the drawer) then the method 800 continues and again selects 808 a next local service to perform.

In various embodiments, if the local service tool is disengaged, the method 800 continues and enables 822 the selected remove service functions. The method continues, in some embodiments, and determine 824 whether local service is finished. If not, the method 800 continues and returns to selecting 808 the local service to perform. If local service is finished, the method 800 includes in some embodiments, closing 826 the enclosure and the method 800 ends. All or portions of the steps of the method 800 may be implemented using the local service permission tool 112, the accessory interface 104, the status module 204, and/or the access module 206.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus comprising:
  an accessory interface for a management console of a computing system, the accessory interface disposed in a management enclosure and configured to engage with a local service permission tool, the management enclosure having a closed position with a predetermined boundary dimension and an open position, wherein engaging the local service permission tool with the accessory interface prevents the management enclosure from being in the closed position;
  a status module that detects whether the local service permission tool is engaged; and
  an access module that disables one or more predetermined remote service functions of the management console in response to the status module detecting that the local service permission tool is engaged.

2. The apparatus of claim 1, wherein the accessory interface is disposed in the management enclosure at a position such that engaging the local service permission tool with the accessory interface causes at least a portion of an element selected from the local service permission tool and the management console to extend beyond the predetermined boundary dimension of the management enclosure.

3. The apparatus of claim 2, wherein the management enclosure comprises one or more structures selected from a drawer, a lid, a tray, a compartment, a cabinet, and combinations thereof.

4. The apparatus of claim 1, wherein the local service permission tool is configured to detachably disengage from the accessory interface.

5. The apparatus of claim 1, wherein the local service permission tool is attached to the accessory interface and is configurable to move between an extended position that prevents the management enclosure from being in the closed position and a retracted position that allows the management enclosure to be in the closed position.

6. The apparatus of claim 5, wherein in the extended position at least a portion of the local service permission tool extends beyond the predetermined boundary dimension of the management enclosure.

7. The apparatus of claim 1, wherein the management enclosure in the closed position encloses one or more devices selected from a keyboard, a monitor, the management console, network switches for remote service, and a secondary management console.

8. The apparatus of claim 1, wherein the status module detects an electrical connection in the accessory interface established by engagement of the local service permission tool with the accessory interface.

9. The apparatus of claim 8, wherein the electrical connection in the accessory interface is established by the local service permission tool performing at least one of acting as an electrical jumper, triggering closure of a magnetic switch, and triggering closure of an optical switch.

10. The apparatus of claim 1, wherein the access module further selects which of the one or more predetermined remote service functions of the management console to disable based on one or more potentially disruptive local service functions scheduled to be performed during engagement of the local service permission tool.

11. The apparatus of claim 10, wherein the one or more potentially disruptive local service functions are selected from removing power from the computing system and taking portions of the computing system offline outside of normal code-controlled paths.

12. A method comprising:
providing a local service permission tool,
providing an accessory interface for a management console of a computing system, the accessory interface disposed in a management enclosure and configured to engage with the local service permission tool, the management enclosure having a closed position with a predetermined boundary dimension and an open position, wherein engaging the local service permission tool with the accessory interface prevents the management enclosure from being in the closed position;
detecting whether the local service permission tool is engaged; and
disabling one or more predetermined remote service functions of the management console in response to detecting that the local service permission tool is engaged.

13. The method of claim 12, further comprising disposing the accessory interface at a position within the management enclosure whereby engaging the local service permission tool with the accessory interface causes at least a portion of an element selected from the local service permission tool and the management console to extend beyond the predetermined boundary dimension of the management enclosure.

14. The method of claim 12, wherein the management enclosure comprises one or more structures selected from a drawer, a lid, a tray, a compartment, and combinations thereof.

15. The method of claim 12, further comprising configuring the local service permission tool to detachably disengage from the accessory interface.

16. The method of claim 12, further comprising configuring the local service permission tool to be attached to the accessory interface and to move between an extended position that prevents the management enclosure from being in the closed position and a retracted position that allows the management enclosure to be in the closed position.

17. The method of claim 16, wherein in the extended position at least a portion of the local service permission tool extends beyond the predetermined boundary dimension of the management enclosure.

18. The method of claim 12, further comprising detecting an electrical connection in the accessory interface established by engaging the local service permission tool with the accessory interface to perform at least one of acting as an electrical jumper, triggering closure of a magnetic switch, and triggering closure of an optical switch.

19. The method of claim 12, selecting which of the one or more predetermined remote service functions of the management console to disable based on one or more potentially disruptive local service functions scheduled to be performed during engagement of the local service permission tool, the one or more potentially disruptive local service functions being selected from removing power from the computing system and taking portions of the computing system offline outside of normal code-controlled paths.

20. A system comprising:
a computing system having a management console;
a management enclosure within the computing system and having a closed position with predetermined boundary dimension and an open position, a local service permission tool; and
an accessory interface for the management console, the accessory interface disposed in the management enclosure and configured to engage the local service permission tool with the accessory interface thereby preventing the management enclosure from being in the closed position,
wherein the management console:
detects whether the local service permission tool is engaged; and
disables one or more predetermined remote service functions of the management console in response to detecting that the local service permission tool is engaged.

* * * * *